United States Patent [19]

Sutrina

[11] Patent Number: 5,347,160
[45] Date of Patent: Sep. 13, 1994

[54] POWER SEMICONDUCTOR INTEGRATED CIRCUIT PACKAGE

[75] Inventor: Thomas A. Sutrina, Rockford, Ill.

[73] Assignee: Sundstrand Corporation, Rockford, Ill.

[21] Appl. No.: 951,591

[22] Filed: Sep. 28, 1992

[51] Int. Cl.$^5$ ............ H01L 23/48; H01L 29/46; H01L 29/54; H01L 29/52
[52] U.S. Cl. .................. 257/698; 257/678; 257/690; 257/691; 257/774; 257/784
[58] Field of Search ........... 257/698, 688, 699, 704, 257/734, 678, 690, 691, 692, 693, 734, 774, 784, 798

[56] References Cited

U.S. PATENT DOCUMENTS

| | | | |
|---|---|---|---|
| 2,897,419 | 7/1959 | Howland et al. | 257/688 |
| 4,639,759 | 1/1987 | Neidig et al. | 357/74 |
| 4,646,129 | 2/1987 | Yerman et al. | 357/74 |
| 4,830,979 | 5/1989 | Crowe et al. | |
| 4,902,854 | 2/1990 | Kaufman | 174/52.4 |
| 4,954,876 | 9/1990 | Crowe et al. | 357/76 |
| 4,985,752 | 1/1991 | Crowe et al. | 357/79 |
| 5,034,803 | 7/1991 | Crowe et al. | 357/76 |
| 5,103,290 | 4/1992 | Temple et al. | 257/698 |

Primary Examiner—Jerome Jackson
Assistant Examiner—Carl Whitehead, Jr.
Attorney, Agent, or Firm—Antonelli, Terry, Stout & Kraus

[57] ABSTRACT

A hermetically sealed semiconductor package (10, 100, 200) in accordance with the invention and includes at least one integrated circuit (14, 15 or 16) with each integrated circuit having first (20) and second (22) opposed faces with the first face having at least one electrode (17-19) providing at least one first circuit connection to the integrated circuit and with the second face providing a second circuit connection to the integrated circuit; a thermally conductive base (32) thermally coupled to the second face for conducting heat generated by operation of the at least one integrated circuit; an insulator (30) electrically isolating the first circuit connection from the second circuit connection; a sidewall (34) extending upward from the base; and a lid (36) extending from the sidewall, the base, sidewall and lid forming a hermetically sealed cavity (12) in which the at least one integrated circuit is disposed and the lid having at least one depression (38) projecting inward below an inner and outer surface of the lid into the cavity and electrically contacting at least one of the circuit connections at a plane below the inner surface of the lid within the cavity.

36 Claims, 7 Drawing Sheets

POWER SEMICONDUCTOR INTEGRATED CIRCUIT PACKAGE

TECHNICAL FIELD

The present invention relates to packages for power semiconductors which do not utilize compression bonding for completing electrical connection between power semiconductor integrated circuits within a hermetically sealed package and external contacts connected to the package.

BACKGROUND ART

Power semiconductors are utilized in diverse applications for controlling current in accordance with a control signal such as a switching signal or a signal to be amplified in which one or more integrated circuits are contained within a hermetically sealed package. One or more control signal inputs are applied to the hermetically sealed package to produce a controlled high power current output signal. Such semiconductor hermetically sealed packages may be used for inverters for switching a pair of DC potentials applied to the hermetically sealed package under the control of a switching signal having a frequency of 400 Hz. for generating three phase alternating current in airframes at 400 Hz. The assignee of the present invention manufactures inverters which are used in airframes for switching DC potentials applied to hermetically sealed packages containing power semiconductor integrated circuits for producing three phase alternating current.

A first type of hermetically sealed power semiconductor integrated circuit package which has been developed by the assignee utilizes compression bonding. With compression bonding, a compressive force is applied to power semiconductor integrated circuits located within the hermetically sealed package to complete the necessary high power electrical connections for controlling the flow of high power current through the package. Compression bonded circuits for controlling the switching of large currents to produce three phase 400 Hz. alternating current have been developed by the assignee. For example, see U.S. Pat. Nos. 4,830,979, 4,954,876, 4,985,752 and 5,034,803. The present invention does not relate to this type of hermetically sealed power semiconductor integrated circuit package. Compression bonding cannot be used with insulated gate bipolar transistor (IGBT) power semiconductors.

A second type of hermetically sealed power semiconductor integrated circuit package, which does not utilize compression bonding to complete connections through which high power current flows to one or more semiconductor integrated circuits within the package, utilizes wire bonds which are connected to a plurality of electrodes on a first face of at least one semiconductor integrated circuit to a metallic bus. The individual electrodes are connected to circuits contained within the integrated circuit which are operated in parallel to provide a high power output by connecting the electrodes in parallel. One or more conductors, which are electrically connected to the bus, extend from inside of the hermetically sealed package to outside the package. A second face of the semiconductor integrated circuit functions as a second electrode which is in common with a plurality of individual circuits located within each semiconductor integrated circuit which function to amplify or switch current in parallel to provide the high power controlled current for use external to the hermetically sealed package. A metallic thermally conductive base is thermally connected to the second face of the semiconductor integrated circuit to provide a heat sink to dissipate heat caused by the operation of the circuits within the semiconductor integrated circuit. Moreover, the conductive base may function as one of the power terminals external to the hermetically sealed package.

While the use of one or more semiconductor integrated circuits contained within a hermetically sealed package which individually contain a plurality of individual circuits which produce a common output in parallel using wire bonds to produce a controlled current such as a switched or amplified high power current has diverse applications, there are a number of disadvantages consequent from the wire bonding between the power electrodes of the at least one integrated circuit and the external connections to the hermetically sealed package. First, the wire bonds represent an inductive load which slows the rate at which current may be changed in response to a control signal applied to the hermetically sealed package. Second, once the package is hermetically sealed, it is impossible to determine whether individual circuits within a semiconductor integrated circuit which are being operated in parallel to produce a high power output are, in fact, operating or operating up to power specification since there is no mechanism available to monitor the signal output or temperature of individual electrodes of the individual parallel circuits within a semiconductor integrated circuit.

U.S. Pat. No. 4,646,129 discloses a hermetically sealed package for semiconductor circuits. The '129 patent discloses electrical connections between a power semiconductor circuit located within a cavity of the hermetically sealed package and an electrical conductor mounted on an external surface of the package by conductors extending through a dielectric plate.

Recently, IGBTs have become available which have a highly desirable characteristic for switching high currents at high voltages to generate alternating current. However, IGBTs are not available in compression bonded configurations which are utilized with high power bipolar transistor switches. The advantage of IGBT is that smaller signal levels may be used for controlling the switching of a IGBT than a bipolar transistor.

Prior art electrical connections from inside of a chamber of a hermetically sealed power semiconductor integrated circuit package to the outside which are used to make electrical connections external to the power semiconductor integrated circuit within the package have used pins. The pins are typically brazed or sealed with glass or ceramic into an aperture through an insulator in a sidewall. The resistance of the pins for high power circuits may result in undesired heating and electrical loss and further contribute to the inductance of the circuitry within the hermetically sealed package which is undesirable for switching applications, such as those used in inverters.

External bus connections in the prior art hermetically sealed packages have been connected to pins extending through the walls or lid of the hermetically sealed package which produces an offset between the outer surface of the hermetically sealed package and the bus. This offset produces a higher profile package which increases the overall volume of the package which is undesirable in applications for inverters used for generating three phase alternating current in airframes where spatial utilization is important.

The breakdown voltage for a fixed gap of atmospheric air varies as a function of altitude in accordance with Paschen' Law which is expressed as:

$$V = f(\rho d)$$

where $\rho$ is the gas density and d is the gap. As a result, a greater atmospheric spacing is needed at high altitudes of aircraft operation to prevent electrical breakdown between different electrical potentials of an electrical power generating system. As a result of Paschen's law, greater separation is required between different external buses of an inverter airplane electrical power generating system operated at different potentials at high altitude when compared to lower altitude operation. The geometry and materials of a hermetically sealed package containing the switches of an inverter electrical power generating system determine the available spacing between different potential buses and the package and mounting structure.

DISCLOSURE OF INVENTION

The present invention provides a hermetically sealed semiconductor package for power semiconductor circuits utilized for controlling current flow through the semiconductor package of hundreds of amperes at hundreds of volts potential such as utilized for switching DC potentials to produce three phase 400 Hz. AC in airplanes. The hermetically sealed semiconductor package in accordance with the invention establishes electrical connections between at least one power semiconductor integrated circuit disposed within the package to the outside of the package by use of at least one depression within a lid which is part of the structure forming a hermetically sealed cavity in which the at least one power semiconductor integrated circuit is disposed. The depression projects inward below inner and outer surfaces of the lid into the cavity, touches and electrically contacts a part of a circuit connection to at least one integrated circuit at a plane below the inner surface.

The use of depressions in the lid to establish electrical connections to at least one power semiconductor integrated circuit within the cavity has advantages when compared to the prior art as discussed above. In the first place, the depressions lessen inductance when compared to electrical connections using pins extending through the structure of the hermetically sealed package and wire bonding to connect power semiconductor integrated circuit electrodes to the pins. Additionally, in a typical power application in which the at least one power semiconductor integrated circuit contains a plurality of individual circuits, such as IGBT switching circuits used in an inverter, the depressions may be in direct contact with power electrodes of the at least one power semiconductor integrated circuit to eliminate the use of wire bonds as in the prior art which made connections between the power electrodes of individual electrodes of circuits operated in parallel in the power semiconductor integrated circuit and conductors which were electrically connected to the outside of the hermetically sealed package. Moreover, the depressions, which may contain strain relief structures, such as a bellows or flexation lines, may be spaced apart on the lid with a sufficient distance when connected to power electrodes of the integrated circuits at different potentials to provide the necessary dielectric isolation which is required for high altitude operation. For example, as discussed above, in a high altitude aircraft electrical power generation systems using inverters up to a half an inch of separation is required between buses of different potentials. Pin connections through the side walls of a hermetically sealed package which contains an inverter of a three phase 400 Hz. aircraft electrical power generating system in the prior art are difficult to separate with sufficient spacing to provide the necessary dielectric isolation. Additionally, the depressions within the lid of the semiconductor package permit buses to be connected directly to the portion of the depression which is flush with the outer surface of the lid which results in a lower vertical profile than in the prior art where the buses were offset above the external surface at the point of connection to the end of pins extending from inside to outside the package. Furthermore, the depressions, which may be electrically connected in common, when the lid is conductive or electrically isolated when connected respectively to different power electrodes of at least one power semiconductor integrated circuit, have low resistance and low inductance which is useful in applications such as high speed switching used in inverters where rapid turn on and turn off of electrical switches within the integrated circuits such as IGBTs is important. Furthermore, the strain relief provided between the lid and the remainder of the package as a consequence of the depressions permits a brittle insulator to be used as the lid without the likelihood of cracking produced by strain between the lid and other parts of the power semiconductor integrated circuit package produced by thermal cycling. The alignment of the lid containing the depression with the remainder of the power semiconductor integrated circuit package for purposes of final assembly provides substantial alignment of the depressions and underlying electrical conductors or electrodes to which the depressions are connected with final alignment between the depressions and conductors or electrodes where necessary being accomplished by bending or deforming the depression to the desired final alignment. Finally, when the depressions are electrically connected directly to power electrodes of one or more power semiconductor integrated circuits each having a plurality of power electrodes, which are the output of individual circuits within the power semiconductor integrated circuit operated in parallel to produce a power output, the operational status of each individual one of the parallel circuits may be checked externally from the package by measuring the temperature of the point of contact of the depression with the power electrode of the semiconductor which was not possible in the prior art.

A hermetically sealed semiconductor package in accordance with the invention includes at least one power semiconductor integrated circuit with each power semiconductor integrated circuit having first and second opposed faces with the first face having at least one electrode with the at least one electrode being part of a first circuit connection to the power semiconductor integrated circuit and with the second face being part of a second circuit connection to the power semiconductor integrated circuit; a thermally conductive base thermally coupled to the second face for conducting heat generated by operation of the power semiconductor integrated circuit; a sidewall extending upward from the base; and a lid extending from the sidewall with the base, sidewall and lid forming a hermetically sealed cavity in which the at least one power semiconductor integrated circuit is disposed and the lid having at least one depression projecting inward below an inner and outer surface of the lid within the cavity into the cavity, touching and electrically contacting at least one of the circuit connections at a plane below the inner surface of the lid within the cavity. A plurality of electrodes may be electrically coupled to the lid by the at least one depression with the lid being electrically conductive. At least one electrical conductor may extend through the sidewall which is electrically isolated from the base and the lid and is electrically connected to at least one control electrode of the at least one power semiconductor integrated circuit; and at least one power conductor is electrically connected to the second face of the at least one power semiconductor integrated circuit which extends to an outside surface of the package which is electrically isolated from the base and the lid. The package may further include at least one additional depression which is electrically coupled to at least one control electrode of the at least one power semiconductor integrated circuit with the at least one additional depression being electrically isolated from the at least one depression and a plurality of power electrodes of the at least one power semiconductor integrated circuit are electrically coupled in common to an electrically conductive portion of the lid. A control conductive layer may be disposed within the cavity which is electrically isolated from the base and the sidewall and a bond wire connects the at least one control electrode to the control conductive layer and the at least one additional depression touches and is electrically connected to the control conductive layer. Each depression is tapered to decrease in diameter from a direction of extension of the lid into the cavity and includes strain relief structure within the taper. A plurality of power semiconductor integrated circuits may be disposed within the cavity.

Each power semiconductor integrated circuit has a plurality of electrodes and the lid may have a plurality of depressions. The plurality of electrodes comprise control and power electrodes, at least one depression may be electrically connected to a plurality of the electrodes and a conductor may extend through the sidewall which is electrically insulated from the at least one depression and is electrically connected to at least one of the plurality of electrodes. A conductor extends through the sidewall which is electrically connected to at least one control electrode and the at least one depression is electrically connected to at least one power electrode. The first face may comprise another circuit connection electrically connected to a control electrode and to a conductor extending through the lid and the first circuit connection is electrically connected to a power electrode of the at least one power semiconductor integrated circuit and to at least one depression and the second circuit connection is electrically connected to a power electrode of the power semiconductor integrated circuit and to at least one of the depressions. The first circuit connection may be electrically connected to a power electrode of the at least one integrated circuit and to at least one depression, at least one first connector extends through the sidewall which is electrically connected to at least one control electrode and at least one second conductor extends through the sidewall which is electrically connected to the second circuit connection.

Electrodes of the plurality of power semiconductor integrated circuits connected to the first circuit connection are electrically connected to at least one metallized layer disposed on an insulative layer which is disposed on the base and adjacent to the power semiconductor integrated circuits and at least one of the depressions is in electrical contact with the metallized layer. A plurality of metallized layers may each be disposed on the insulative layer which is disposed on the base with at least one of the metallized layers being electrically connected to a plurality of power electrodes of at least one power semiconductor integrated circuit and to at least one of the depressions and with at least one metallized layer being electrically connected to at least one control electrode of at least one power semiconductor integrated circuit and the lid is an insulative material and a plurality of depressions are respectively electrically connected to a plurality of external circuit connections connected to an outer surface of the lid, at least one of the electrical depressions is electrically connected to electrodes of the first face and at least one of the electrical depressions is connected to the second face of the plurality of integrated circuits.

BEST MODE FOR CARRYING OUT THE INVENTION

Figure 1:
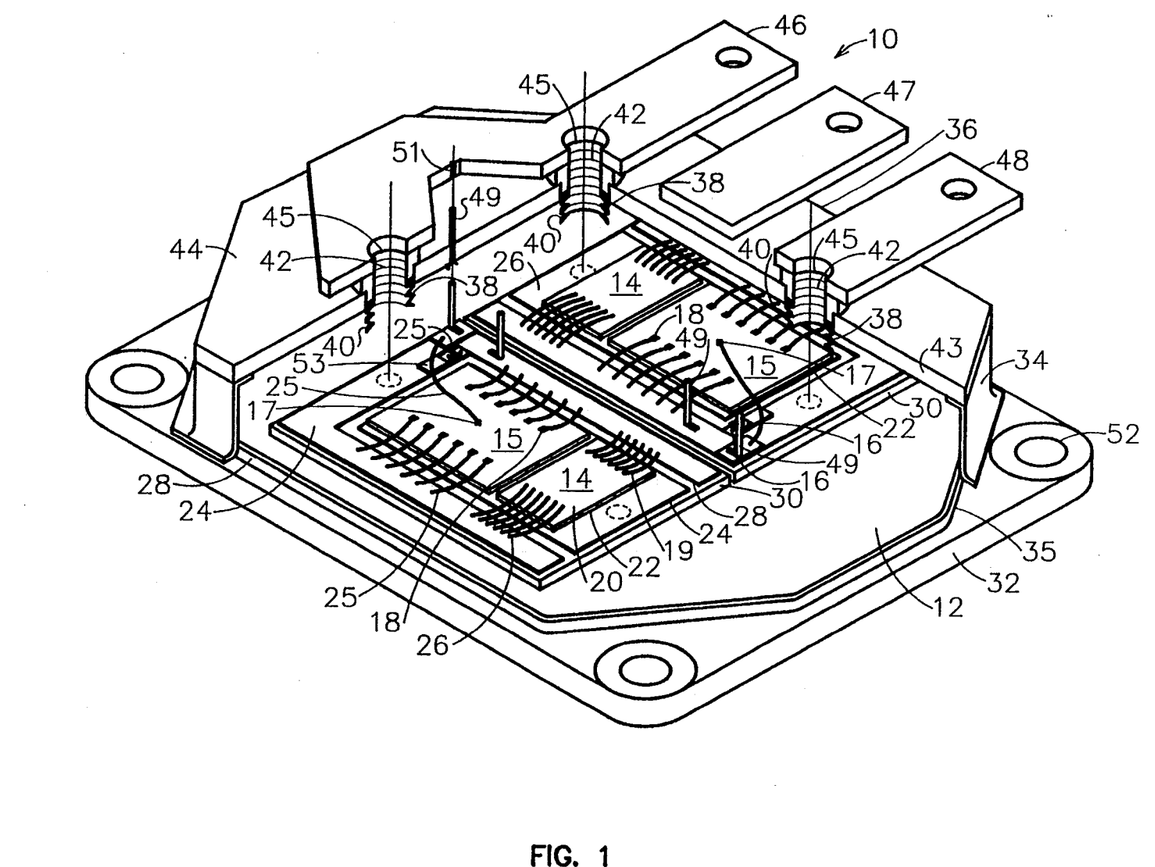
FIG. 1 illustrates an isometric partial sectional view of a first embodiment of the present invention.
Figure 2:
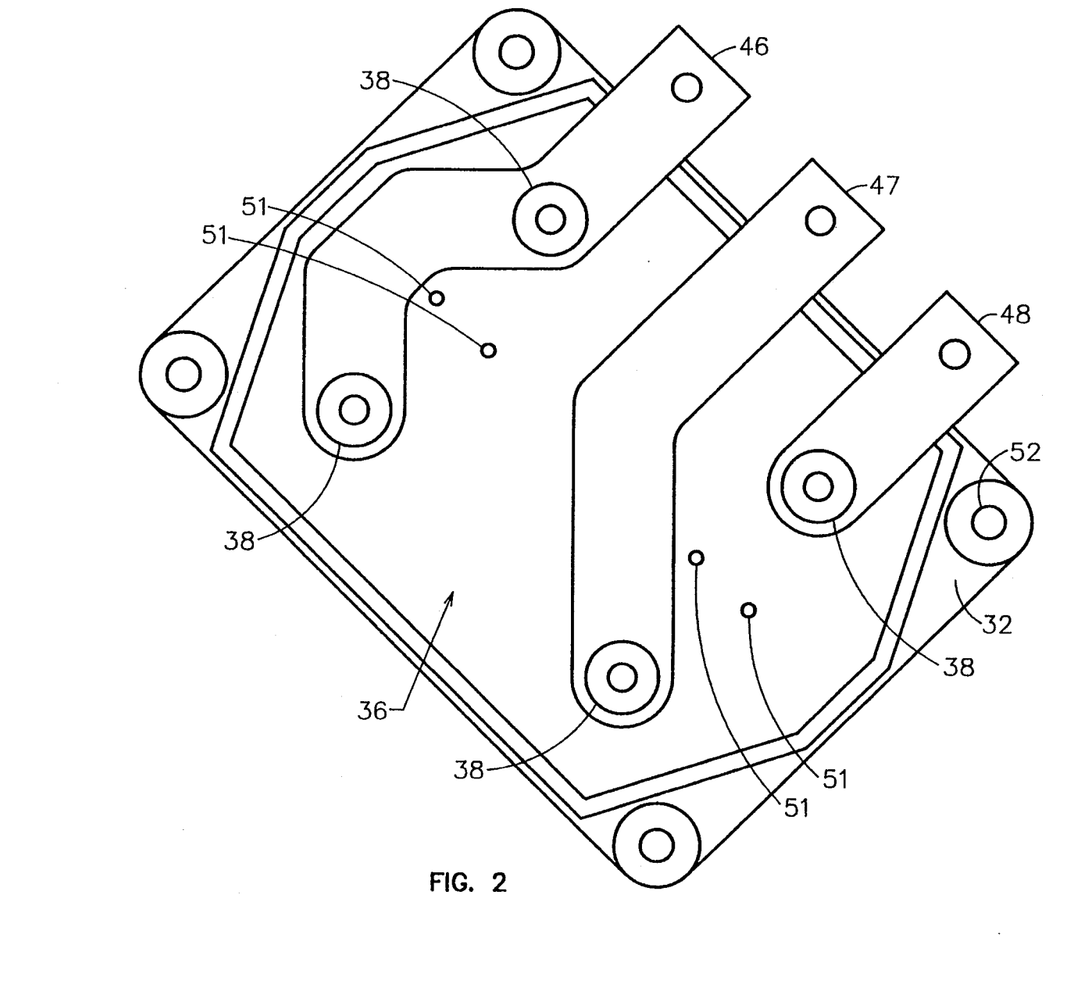
FIG. 2 illustrates a top plan view of the first embodiment of the present invention.
Figure 3:
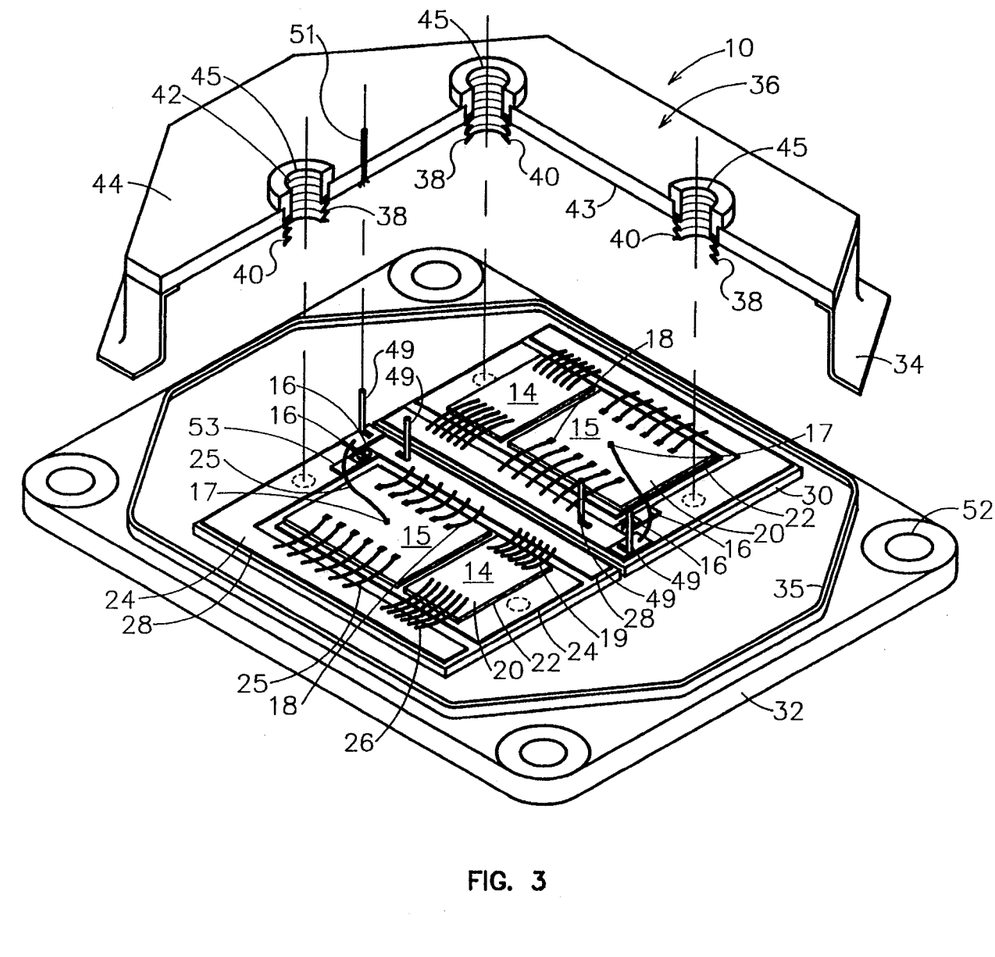
FIG. 3 illustrates an exploded view of the first embodiment of the present invention.

FIGS. 1-3 illustrate a first embodiment of a hermetically sealed package 10 in accordance with the present invention. The hermetically sealed package 10 has a hermetically sealed cavity 12 which includes at least one integrated circuit 14 and 15. FIGS. 1 and 3 illustrate four power integrated circuits 14 and 15 contained in the cavity 12 that control the flow of high current at high voltage through the package 10 of an inverter. The circuits within the package, as illustrated, are electrically connected into the well-known "totem pole" inverter configuration which is connected to two DC rails 47 and 48 at different potentials to produce a single phase AC output 46 at a frequency of 400 Hz. which is the frequency standard for airplane electrical power generation. Three packages, as illustrated in FIGS. 1 and 3, may be operated under common control in accordance with known practice in an airplane to generate the fundamental 3φ 400 Hz. electrical power prior to filtering to remove undesired harmonics. In an inverter configuration, the circuits 14 are flyback diodes and the circuits 15 are IGBTs containing power switches which are switched at the fundamental frequency of 400 Hz. Additionally, a pair of series connected Zener diodes 16 provide high voltage protection to prevent damage to the power semiconductor integrated circuits. The power semiconductor integrated circuits 15 have at least one control terminal 17 and at least one power terminal 18 located on a first face 20 which is opposed to a second face 22 which is in electrical contact with a conductive layer 24 which may be copper layer such as that used with printed circuits. The conductive layers 24 are disposed on an insulative layer 30 which is thermally conductive and is coated with a pattern of direct bonded copper 28 or other metallization such as that described below. The layer 30 may be AlN or BeO. The electrodes 17 and 18 on the first face are respectively part of circuit connections to the integrated circuit 15. Electrical connections with the electrodes 17 and 18 of the first face 20 to circuitry external to the circuits 15 are made with wire bonds 25 which are conventional for making connections with integrated circuits. While not limited thereto, the integrated circuits 15 may include a plurality of individual circuits each of which contain IGBTs which have outputs connected in parallel to the power electrodes 18 to provide a high power output of current of hundreds of amperes and volts potential. The wire bonds 25 are connected to circuit board connections 26. The metallized layer 28, such as direct bond copper, which is plated on both sides of the previously described insulative layer 30 in the desired circuit layout which is in turn disposed on a conductive base 32. The metallized insulator 30, which is coated with metallization on both sides, as described above, is attached to the base 32 and to the conductive layers 24 with solder or other melted metal connection to transfer heat. The integrated circuits 14 and 15 are power devices which control the flow of high levels of current through the package at high potentials, such as potentials which are switched in inverters for producing three phase 400 Hz. alternating current for use in airplanes which use VSCF (variable speed constant frequency) electrical power generation which is a preferred application of a hermetically sealed semiconductor package in accordance with the present invention.

The overall package is comprised of base 32, a sidewall 34 extending upward from the base to a lid 36 which, as illustrated, is insulative. However, it should be understood that subsequent embodiments of the invention, as described below, have different bases sidewalls and lids with different electrical and/or thermal conductivity. The base 32, sidewall 34 and lid 36 form the hermetically sealed cavity 12 in which the power semiconductor integrated circuits 14, 15 and 16 are disposed. It should be understood that the present invention is not limited to the geometrical configuration of the cavity 12 or the number and type of circuits contained therein. The sidewall 34 may be a cold welded copper skirt which is well known. Coldweld interface feature 35 of base 32 is a raised encircling mesa. The base 32 is thermally coupled to the second face 22 of each of the integrated circuits 14 and 15 to function as a heat sink for the heat generated by the operation of the power integrated circuits. The base 32 is also electrically conductive and while not illustrated in FIGS. 1 and 3 may function as part of a circuit connection with the second face 22 of the power semiconductor integrated circuits 14 and 15 through which high power electrical current flows under the control of a control signal applied to a circuit board 53 which is an insulator (e.g. ceramic with matched CTE) coated with metallization on both sides which is attached to conductive layer 24. The base 32 may be formed from different types of thermally conductive materials such as center-clad molybdenum or a metal matrix, such as aluminum containing silicon carbide. The base 32 has a thermal coefficient of expansion which may closely match that of the materials from which the integrated circuits 14, 15 and 16 are manufactured so as to avoid strain-related failures caused by thermal cycling. The lid 36 may be an inexpensive insulator such as aluminum oxide $Al_2O_3$. It should be noted that the lid 36 is not subject to large temperature gradients caused by thermal cycling for the reason that heat generated by operation is dissipated by the base 32.

The lid 36 performs an important function of the present invention by providing low resistance, low inductance electrical connections by means of depressions 38 as described below directly with either the power electrodes 18 as described below in the embodiments of FIGS. 4 and 5 or to the conductive layers 24. The lid 36 contains at least one depression 38 which may have different forms such as, but not limited to, those described below in conjunction with FIGS. 6 and 7. The depressions 38 are electrically conductive, contain strain relief structure 40 in the form of flexible, bent metallic sections which permit flexure to relieve thermally induced strain and to further permit bending to align the depressions with underlying electrically conductive structures such as power electrodes or buses during assembly as described below in FIGS. 6 and 7. The lid 36 extends from the sidewall 34. The base 32, sidewall 34 and lid 36 form the hermetically sealed cavity 12 in which the at least one power semiconductor integrated circuit 14–16 is disposed. The at least one depression 38 projects inward below an inner surface 43 and outer surface 44 of the lid into the cavity and electrically contacts at least one circuit connection of the power semiconductor integrated circuits 14 and 15 at a plane below the inner surface of the lid within the cavity. The top 42 of the depression 38 is substantially flush with a top surface 44 of the lid 36. As a result, electrical buses 46–48 may be connected substantially flush with the top surface 44 to provide a low vertical profile when compared to the prior art which connected external buses to metal posts extending above the plane of the circuit with a crimped connection. The depressions 38 may contain internal threads 45 which retain fasteners (not illustrated) for connecting the buses 46–48 thereto. Alternatively, a solder or other melted metal connection may be used to attach the buses 46–48 to the depressions 38. In view of the substantial surface area of the top surface 44, the individual buses 46–48 may be separated by sufficient distance to provide a sufficient dielectric constant to avoid arcing when the circuits of the present invention are operated at reduced atmospheric pressures, such as those encountered by operation at high altitude which can occur with inverters which are used for generating electrical power in airframes, which is a preferred application of the present application. Typically, at high altitude, e.g. 70,000 ft., at least one-half of an inch is required between circuit buses 46–48 which are operating at substantially different electrical potentials in the order of several hundred volts. The extension of the individual buses 46–48 across the top surface 44 in electrical connection with a plurality of depressions 38 is illustrated in FIG. 2. As stated above, in a single phase inverter configuration the bus 46 is the AC output and the buses 47 and 48 are the different potential DC rails. A control terminal 49 extends through an aperture in the lid 36 down into the cavity 12 to make electrical connection with a control circuit board connection 26. The control signal, which is applied to sheath 51 which is crimped to the control pin 49, is conducted to the circuit below. Bores 52 permit connectors (not illustrated) to mount the package in place. As illustrated, the buses 46-48 provide external electrical connections to the power electrodes 19 of the power semiconductor integrated circuits 14 and the power electrodes 18 of the power semiconductor integrated circuits 15 disposed on the first face 20. The second face 22 of the integrated circuits 14-16, which is part of a second circuit connection, conducts through conductive layers 24 which are connected to the bus 47 as illustrated in FIG. 2 and to the bus 48 as illustrated in FIGS. 1 and 2.

The final hermetic seal, which defines the hermetically sealed cavity 12, is provided by a selectable combination of metal to metal or metal to non-metal bonding techniques such as cold welding, welding brazing and soldering. The present invention is not limited to any particular technique for forming the final sealed connections of the base 32, sidewall 34 and lid 36 forming the hermetically sealed cavity 12.

Figure 4:
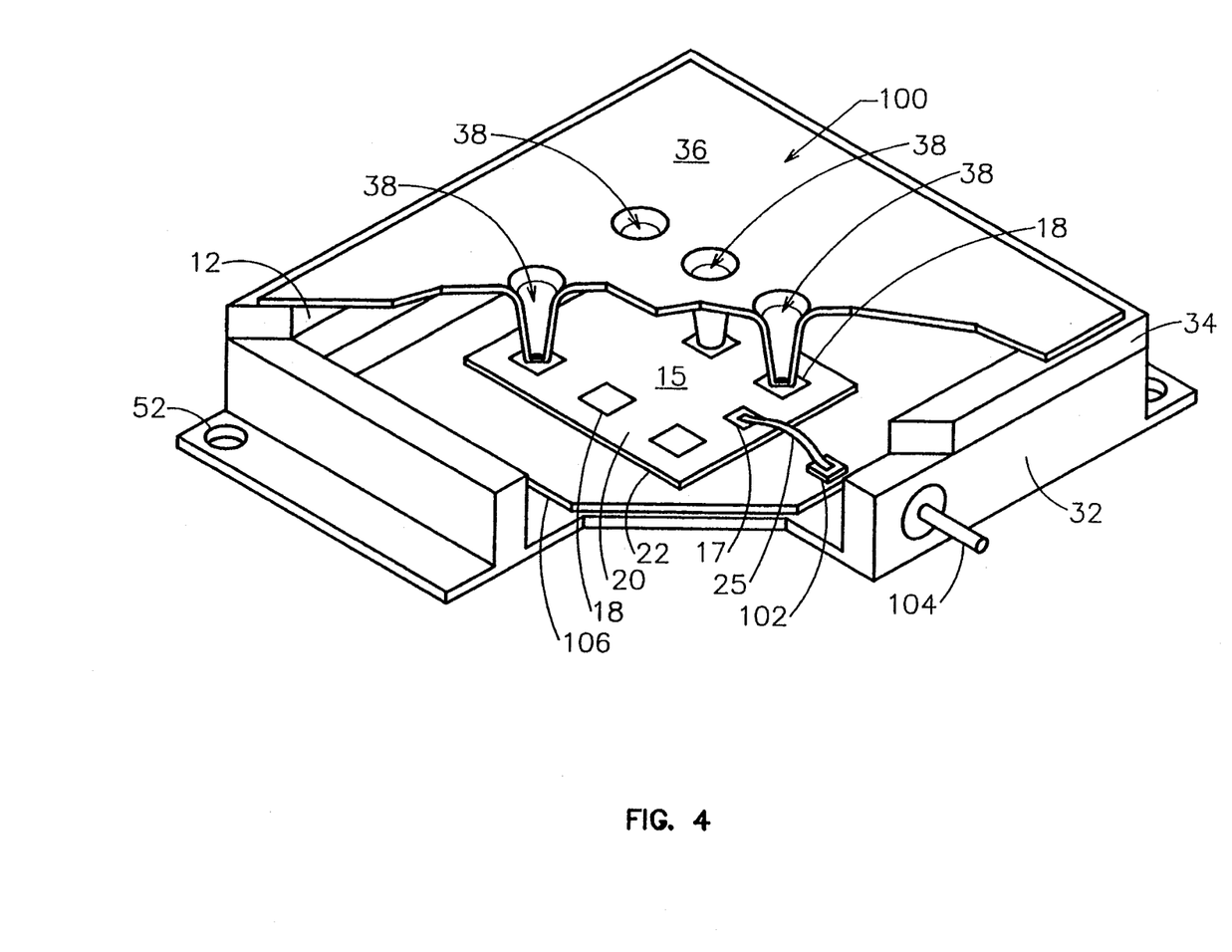
FIG. 4 illustrates an isometric partial sectional view of a second embodiment of the present invention.

FIG. 4 illustrates a second embodiment of a hermetically sealed semiconductor package 100 in accordance with the present invention. Like reference numerals identify like parts in FIGS. 1-4. Parts which are identical to those described above in conjunction with the first embodiment will not be discussed herein in detail. The second embodiment differs from the first embodiment in that only a single power semiconductor integrated circuit 15 is disposed within the cavity 12 instead of a plurality of power semiconductor integrated circuits. Additionally, the base 32 extends vertically upward a greater distance than the base of FIG. 1. The sidewall 34 is an insulator which may be manufactured from a low cost insulative material such as $Al_2O_3$ as a consequence of it not being part of a thermal circuit dissipating heat. Additionally, the depressions 38 extend directly down into contact with the power electrodes 18 of the power semiconductor integrated circuit 15 instead of making electrical contact with a conductive layer 106 as with the embodiment of FIG. 1. Additionally, the lid 36 is manufactured from an electrically conductive material, such as copper or aluminum. Each of the plurality of depressions 38 is electrically common by electrical conduction through the lid 36 and is connected to different power electrodes 18 of the power semiconductor integrated circuit 15. It should be noted that each depression 38 is tapered and decreases in diameter from a direction of extension of the lid 36 into the cavity 12 and includes strain relief structure (not illustrated) as, for example, discussed below in conjunction with FIGS. 6 and 7.

The control electrode 17 is connected to the outside of the semiconductor package 100 by an electrical conductor 102 which extends through the base 32. Insulator 104, which may be glass or ceramic, electrically isolates the conductor 102 from the base 32 which is electrically connected to the backside 22 of the power semiconductor integrated circuit 15 and also functions in addition to being a heat sink as a power terminal for the individual circuits within the integrated circuit which have power terminals 18 on face 20 of the integrated circuit. The power semiconductor integrated circuit 15 is disposed upon a conductive layer 106, such as molybdenum or a thin layer of copper to which the power semiconductor integrated circuit may be soldered, which has a coefficient of thermal expansion which closely matches that of the power semiconductor integrated circuit 15 to avoid failures caused by strain produced by thermal cycling of the integrated circuit caused by turning on and turning off.

The direct electrical connection of the depressions 38 with power electrodes of the power semiconductor integrated circuit(s) permits the measurement of the operational temperature of the individual power electrodes 18. The measurement of temperature permits testing to be performed to determine whether the individual circuits within a power semiconductor integrated circuit which are electrically connected in parallel with common power output terminals, are operating. For example, a temperature below that which is normally encountered during operation indicates that the circuit which is electrically connected to the power terminal 18 is not operating or is operating with insufficient electrical output. On the other hand, a measured temperature of the power terminal 18 above that which is normal operating temperature indicates that the circuit is operating above a desired power output.

Figure 5:
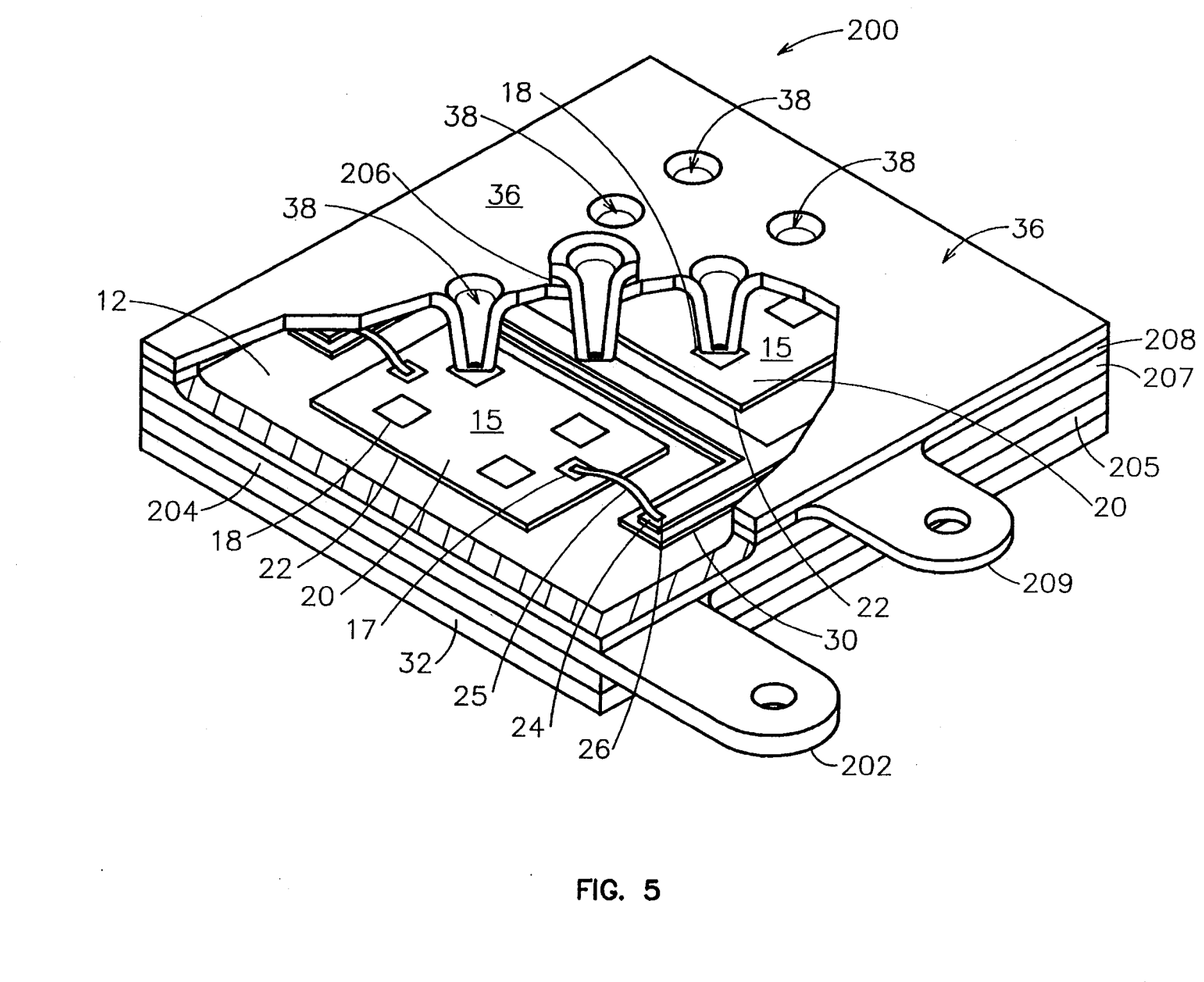
FIG. 5 illustrates a partial sectional view of third embodiment of the present invention.

FIG. 5 illustrates a third embodiment of a hermetically sealed semiconductor package 200 in accordance with the present invention. Like reference numerals identify like parts in FIGS. 1-5. It should be noted that parts which are identical to those described above with respect to the first and second embodiments will not be discussed in detail in conjunction with FIG. 5. The third embodiment 200 differs from the second embodiment in several aspects. First, the electrical output from the individual power semiconductor integrated circuits 15 from the backside surface 22 is outputted through terminal 202. Terminal 202 is part of an electrically conductive layer 204 which is electrically connected to the backside 22 of the power semiconductor integrated circuits 15 and has a coefficient of thermal expansion which may closely match that of the material from which the integrated circuit is manufactured or is a thin layer of copper. The base 32 is highly thermally conductive and is made from a material such as copper. Layer 205 is a highly thermally conductive insulator such as AlN or BeO. Layer 207 is an insulator, such as $Al_2O_3$, which is not highly thermally conductive and is inexpensive. Layer 208, which contains a terminal 209 providing an external connection to the conductive lid 36, conducts the high power flowing through the power semiconductor integrated circuits and may be copper. The lid 36, which may be copper or aluminum, is brazed onto the layer containing the terminal 208. The external connection to the conductive layer 24 is through a circuit board connection 26 which is connected to a depression 38 in the lid 36 which is electrically isolated from the electrically conductive lid by an insulative ring 206. A suitable electrical connection is made to the control terminal 17 by wire bond 25 and conductive layer 24 through the depression 38, which is isolated from the lid 36 by the insulator 206, by an electrical connection such as that described below in conjunction with FIGS. 6 and 7. The remaining depressions 38 are electrically connected in common to the conductive lid 36 and to the power electrodes 18 of the individual power circuits within the power integrated circuits 15. The terminal 209 and of layer 208 are electrically connected to the electrically conductive lid 36 to provide an external electrical connection from the individual power electrodes 18 of the integrated circuits 15. The third embodiment 200 has the same advantage as the second embodiment 100 described above in that the temperature of the individual power electrodes 18 during operation may be monitored to determine the operational characteristic of the individual power semiconductor integrated circuits within the power integrated circuits 15.

Figure 6:
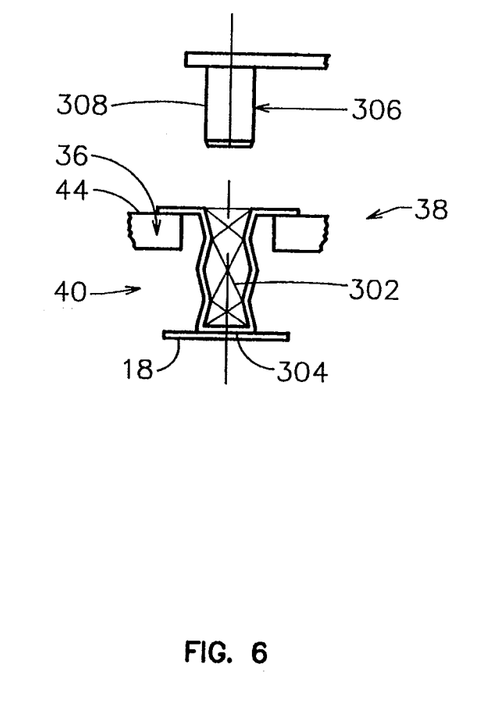
FIG. 6 illustrates a first type of depression in the lid of a hermetically sealed package in accordance with the present invention.

FIG. 6 illustrates a first type of a depression 38 which may be utilized in practicing of the present invention. Like reference numerals identify like parts in FIGS. 1–6. The depression 38 contains strain relief structure 40 which is formed by a series of creases 302 which intersect in a diamond pattern around the circumference of the depression 38 to provide the ability to relieve strain upon thermal cycling. Additionally, the creases 302 permit the bending of the depressions 38 to provide proper alignment with the power electrodes 18 of the power integrated circuits 15 during final assembly of the package. One method of performing this function is to have a photographic mask of the pattern of the underlying power electrodes 18 or control electrodes 17 which are to be electrically connected to the depressions 38. The depressions 38 are attached to the lid 36 by a suitable connecting method such as brazing or formed integrally from lid material. Thereafter, the physical position of the individual depressions 38 as attached to the lid 36 may be compared to the image of the underlying terminals 17 and 18 to permit deflection by bending of the depression 38 to insure proper alignment. As a result, the correct alignment of the depressions 38 with the underlying terminals 17 and 18 may be insured even though final connection of the lid 36 to the sidewall 34 results in a final alignment point of the bottom 304 of the depression 38 being blind with respect to its point of contact with the terminals 17 and 18. Connection to an underlying conductive layer, as discussed above, may have sufficient tolerance to not require alignment bands. A snap-in external electrical connector 306 is retained within the depression 38 by an interference fit. The outside diameter of cylindrical conductor 308 is slightly larger than the minimal inner diameter of the depression 38.

Figure 7:
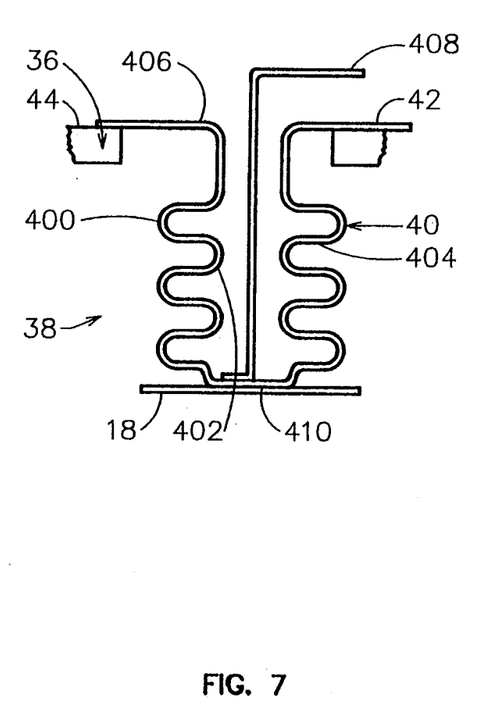
FIG. 7 illustrates a second type of depression in the lid of a hermetically sealed package in accordance with the present invention.

FIG. 7 illustrates a second type of depression 38 which is in the form of a bellows formed from a series of inward and outward bent metal sections 400 and 402 which are connected with straight metal sections 404. The bent metal sections 402 and 404 function as the strain relief structure 40. Additionally, bent metal sections 406 may be located in the top of the depression 42 for providing additional strain relief and an attachment interface with lid 36. Electrical conductor 408 is connected to the bottom 410 of the depression 38 to provide an external connection to the hermetically sealed semiconductor package.

While the depressions 38 of FIGS. 6 and 7 are illustrated as being connected to an insulative layer, it should be understood that alternatively they may be formed within a single metallic sheet such as illustrated in the embodiment of FIG. 4 and the embodiment of FIG. 5. In this situation, the depressions 38 will be an integral part of at least a portion of the lid 36 which is metallic.

While the invention has been described in terms of its preferred embodiments, it should be understood that numerous modifications may be made thereto without departing from the spirit and scope of the invention as defined in the appended claims. For example, it should be understood that the present invention is applicable to a wide range of applications requiring hermetically sealed high power semiconductor circuits. Furthermore, the present invention is not limited to any particular number of power semiconductor integrated circuits which may be contained within an individual cavity of a hermetically sealed semiconductor package in accordance with the present invention. Additionally, the present invention is not limited to having only high power semiconductor integrated circuits located within the cavity 12 of the semiconductor package. Finally, the present invention is not limited to the use of high power integrated circuits having outputs in parallel to produce a high power output such as IGBTs.

I claim:

1. A hermetically sealed semiconductor package comprising:
   at least one integrated circuit with each integrated circuit having first and second opposed faces with the first face having at least one electrode providing at least a first circuit connection to the integrated circuit and with the second face providing a second circuit connection to the integrated circuit;
   a thermally conductive base thermally coupled to the second face for conducting heat generated by operation of the at least one integrated circuit;
   an insulator electrically isolating the first circuit connection from the second circuit connection;
   a side wall extending upward from the base; and
   a lid extending from the side wall, the base, sidewall and lid forming a hermetically sealed cavity in which the at least one integrated circuit is disposed and the lid having at least one depression projecting inward below an inner and outer surface of the lid into the cavity, touching and electrically contacting at least one of the circuit connections at a plane below the inner surface of the lid within the cavity.

2. A package in accordance with claim 1 wherein:
   each integrated circuit has a plurality of electrodes and the lid has a plurality of depressions.

3. A package in accordance with claim 2 wherein:
   the plurality of electrodes comprise control and power electrodes.

4. A package in accordance with claim 1 wherein:
   the integrated circuit has a plurality of electrodes; and
   at least one depression is electrically connected to a plurality of the electrodes; and
   an electrical conductor extends through the sidewall which is electrically insulated from the at least one depression and is electrically connected to at least one of the plurality of electrodes.

5. A package in accordance with claim 1 wherein:
   the plurality of electrodes comprise control and power electrodes and an electrical conductor extends through the sidewall which is electrically connected to at least one control electrode and at least one depression is electrically connected to at least one power electrode.

6. A package in accordance with claim 1 wherein:
   the first face is part of another circuit connection electrically connected to a control electrode and to a conductor extending through the lid and the first circuit connection is electrically connected to at least one power electrode of the at least one integrated circuit and to at least one depression; and
   the second circuit connection is electrically connected to a power electrode of the integrated circuit and to at least one of the depressions.

7. A package in accordance with claim 1 wherein:

the first circuit connection is electrically connected to a power electrode of the at least one integrated circuit and to at least one depression, at least one first conductor extends through the sidewall which is electrically connected to at least one control electrode and at least one second conductor extends through the sidewall which is electrically connected to the second circuit connection.

8. A package in accordance with claim 1 comprising:

a plurality of integrated circuits, electrodes of the plurality of integrated circuits connected to the first circuit connection being electrically connected to at least one metallized layer disposed on an insulative layer which is disposed on the base and adjacent to the integrated circuits and at least one of the depressions touching and electrically contacting the metallized layer.

9. A package in accordance with claim 8 further comprising:

a plurality of metallized layers each disposed on the insulative layer which is disposed on the base with at least one of the metallized layers being electrically connected to a plurality of power electrodes of at least one integrated circuit and to at least one of the depressions and with at least one of the metallized layers being electrically connected to at least one control electrode of at least one integrated circuit; and wherein the lid is an insulative material and a plurality of the depressions are respectively electrically connected to a plurality of external circuit connections connected to an outer surface of the lid, at least one of the electrical depressions being electrically connected to electrodes electrically connected to the first face and at least one of the electrical connections being connected to the second face of the plurality of integrated circuits.

10. A package in accordance with claim 2 comprising:

a plurality of integrated circuits, electrodes of the plurality of integrated circuits connected to the first circuit connection being electrically connected to at least one metallized layer disposed on an insulative layer which is disposed on the base and adjacent to the integrated circuits and at least one of the depressions touching and electrically contacting the metallized layer.

11. A package in accordance with claim 10 further comprising:

a plurality of metallized layers each disposed on the insulative layer which is disposed on the base with at least one of the metallized layers being electrically connected to a plurality of power electrodes of at least one integrated circuit and to at least one of the depressions and with at least one of the metallized layers being electrically connected to at least one control electrode of at least one integrated circuit; and wherein the lid is an insulative material and a plurality of the depressions are respectively electrically connected to a plurality of external circuit connections connected to an outer surface of the lid, at least one of the electrical depressions being electrically connected to electrodes electrically connected to the first face and at least one of the electrical connections being connected to the second face of the plurality of integrated circuits.

12. A package in accordance with claim 3 comprising:

a plurality of integrated circuits, electrodes of the plurality of integrated circuits connected to the first circuit connection being electrically connected to at least one metallized layer disposed on an insulative layer which is disposed on the base and adjacent to the integrated circuits and at least one of the depressions touching and electrically contacting the metallized layer.

13. A package in accordance with claim 12 further comprising:

a plurality of metallized layers each disposed on the insulative layer which is disposed on the base with at least one of the metallized layers being electrically connected to a plurality of power electrodes of at least one integrated circuit and to at least one of the depressions and with at least one of the metallized layers being electrically connected to at least one control electrode of at least one integrated circuit; and wherein the lid is an insulative material and a plurality of the depressions are respectively electrically connected to a plurality of external circuit connections connected to an outer surface of the lid, at least one of the electrical depressions being electrically connected to electrodes electrically connected to the first face and at least one of the electrical connections being connected to the second face of the plurality of integrated circuits.

14. A package in accordance with claim 4 comprising:

a plurality of integrated circuits, electrodes of the plurality of integrated circuits connected to the first circuit connection being electrically connected to at least one metallized layer disposed on an insulative layer which is disposed on the base and adjacent to the integrated circuits and at least one of the depressions touching and electrically contacting the metallized layer.

15. A package in accordance with claim 14 further comprising:

a plurality of metallized layers each disposed on the insulative layer which is disposed on the base with at least one of the metallized layers being electrically connected to a plurality of power electrodes of at least one integrated circuit and to at least one of the depressions and with at least one of the metallized layers being electrically connected to at least one control electrode of at least one integrated circuit; and wherein the lid is an insulative material and a plurality of the depressions are respectively electrically connected to a plurality of external circuit connections connected to an outer surface of the lid, at least one of the electrical depressions being electrically connected to electrodes electrically connected to the first face and at least one of the electrical connections being connected to the second face of the plurality of integrated circuits.

16. A package in accordance with claim 5 comprising:

a plurality of integrated circuits, electrodes of the plurality of integrated circuits connected to the first circuit connection being electrically connected to at least one metallized layer disposed on an insulative layer which is disposed on the base and adjacent to the integrated circuits and at least one of the depressions touching and electrically contacting the metallized layer.

17. A package in accordance with claim 16 further comprising:
a plurality of metallized layers each disposed on the insulative layer which is disposed on the base with at least one of the metallized layers being electrically connected to a plurality of power electrodes of at least one integrated circuit and to at least one of the depressions and with at least one of the metallized layers being electrically connected to at least one control electrode of at least one integrated circuit; and wherein
the lid is an insulative material and a plurality of the depressions are respectively electrically connected to a plurality of external circuit connections connected to an outer surface of the lid, at least one of the electrical depressions being electrically connected to electrodes electrically connected to the first face and at least one of the electrical connections being connected to the second face of the plurality of integrated circuits.

18. A package in accordance with claim 6 comprising:
a plurality of integrated circuits, electrodes of the plurality of integrated circuits connected to the first circuit connection being electrically connected to at least one metallized layer disposed on an insulative layer which is disposed on the base and adjacent to the integrated circuits and at least one of the depressions touching and electrically contacting the metallized layer.

19. A package in accordance with claim 18 further comprising:
a plurality of metallized layers each disposed on the insulative layer which is disposed on the base with at least one of the metallized layers being electrically connected to a plurality of power electrodes of at least one integrated circuit and to at least one of the depressions and with at least one of the metallized layers being electrically connected to at least one control electrode of at least one integrated circuit; and wherein
the lid is an insulative material and a plurality of the depressions are respectively electrically connected to a plurality of external circuit connections connected to an outer surface of the lid, at least one of the electrical depressions being electrically connected to electrodes electrically connected to the first face and at least one of the electrical connections being connected to the second face of the plurality of integrated circuits.

20. A package in accordance with claim 7 comprising:
a plurality of integrated circuits, electrodes of the plurality of integrated circuits connected to the first circuit connection being electrically connected to at least one metallized layer disposed on an insulative layer which is disposed on the base and adjacent to the integrated circuits and at least one of the depressions touching and electrically contacting the metallized layer.

21. A package in accordance with claim 20 further comprising:
a plurality of metallized layers each disposed on the insulative layer which is disposed on the base with at least one of the metallized layers being electrically connected to a plurality of power electrodes of at least one integrated circuit and to at least one of the depressions and with at least one of the metallized layers being electrically connected to at least one control electrode of at least one integrated circuit; and wherein
the lid is an insulative material and a plurality of the depressions are respectively electrically connected to a plurality of external circuit connections connected to an outer surface of the lid, at least one of the electrical depressions being electrically connected to electrodes electrically connected to the first face and at least one of the electrical connections being connected to the second face of the plurality of integrated circuits.

22. A package in accordance with claim 1 wherein:
a plurality of electrodes are electrically coupled to the lid by the at least one depression with the lid being electrically conductive.

23. A package in accordance with claim 1 further comprising:
at least one electrical conductor extending through the sidewall, which is electrically isolated from the base and the lid, that is electrically connected to the at least one control electrode of the at least one integrated circuit; and
at least one power conductor, electrically coupled to the second face of the at least one integrated circuit, extending to an outside surface of the package which is electrically isolated from the base and the lid.

24. A package in accordance with claim 1 further comprising:
at least one additional depression which is electrically coupled to at least one control electrode of the at least one integrated circuit with the at least one additional depression being electrically isolated from the at least one depression; and wherein
a plurality of power electrodes of the at least one integrated circuit are electrically coupled in common to an electrically conductive portion of the lid.

25. A package in accordance with claim 24 further comprising:
a control conductive layer disposed within the cavity which is electrically isolated from the base and the sidewall; and
a wire bond connecting the at least one control electrode to the control conductive layer; and wherein
the at least one additional depression touches and is electrically connected to the control conductive layer.

26. A package in accordance with claim 3 further comprising:
at least one additional depression which is electrically coupled to at least one control electrode of the at least one integrated circuit with the at least one additional depression being electrically isolated from the at least one depression; and wherein
a plurality of power electrodes of the at least one integrated circuit are electrically coupled in common to an electrically conductive portion of the lid.

27. A package in accordance with claim 26 further comprising:
a control conductive layer disposed within the cavity which is electrically isolated from the base and the sidewall; and a wire bond connecting the at least one control electrode to the control conductive layer; and wherein the at least one additional depression touches and is electrically connected to the control conductive layer.

28. A package in accordance with claim 23 further comprising:
a metallic electrically conductive sheet in surface contact with the second face and an electrical conductor electrically connected to the conductive sheet extending to an outside surface of package.

29. A package in accordance with claim 21 wherein:
each depression is tapered to decrease in diameter from a direction of extension of the lid into the cavity and includes strain relief structure within the tapper.

30. A package in accordance with claim 22 wherein:
each depression is tapered to decrease in diameter from a direction of extension of the lid into the cavity and includes strain relief structure within the tapper.

31. A package in accordance with claim 23 wherein:
each depression is tapered to decrease in diameter from a direction of extension of the lid into the cavity and includes strain relief structure within the tapper.

32. A package in accordance with claim 24 wherein:
each depression is tapered to decrease in diameter from a direction of extension of the lid into the cavity and includes strain relief structure within the tapper.

33. A package in accordance with claim 25 wherein:
each depression is tapered to decrease in diameter from a direction of extension of the lid into the cavity and includes strain relief structure within the tapper.

34. A package in accordance with claim 26 wherein:
each depression is tapered to decrease in diameter from a direction of extension of the lid into the cavity and includes strain relief structure within the tapper.

35. A package in accordance with claim 27 wherein:
each depression is tapered to decrease in diameter from a direction of extension of the lid into the cavity and includes strain relief structure within the tapper.

36. A package in accordance with claim 28 wherein:
each depression is tapered to decrease in diameter from a direction of extension of the lid into the cavity and includes strain relief structure within the tapper.

* * * * *